United States Patent
Ogasawara

(10) Patent No.: US 8,115,549 B2
(45) Date of Patent: Feb. 14, 2012

(54) AMPLIFIER CIRCUIT AND RADIO RECEIVER

(75) Inventor: Yosuke Ogasawara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/539,034

(22) Filed: Aug. 11, 2009

(65) Prior Publication Data

US 2010/0156538 A1 Jun. 24, 2010

(30) Foreign Application Priority Data

Dec. 22, 2008 (JP) ................................. 2008-325434

(51) Int. Cl.
*H03F 3/45* (2006.01)
(52) U.S. Cl. ....................................... 330/253; 327/552
(58) Field of Classification Search .......... 330/252–261; 327/552, 559; 455/574
See application file for complete search history.

(56) References Cited

U.S. PATENT DOCUMENTS 7,592,863 B2 * 9/2009 Elwan et al. ................... 327/552
2009/0239592 A1 * 9/2009 Deng et al. ..................... 455/574

FOREIGN PATENT DOCUMENTS

JP 06-342561 12/1994

OTHER PUBLICATIONS

Bruccoleri et al, Wide-Band CMOS Low-Noise Amplifier Exploiting Thermal Noise Canceling, IEEE Journal of Solid-State Circuits, vol. 39, No. 2, Feb. 2004.

* cited by examiner

*Primary Examiner* — Hieu Nguyen
(74) *Attorney, Agent, or Firm* — Turocy & Watson, LLP

(57) ABSTRACT

A feedback resistor is connected between an input terminal and an output terminal of an operational amplifier. A negative resistor is connected between an inverting input terminal and a non-inverting input terminal of the operational amplifier.

6 Claims, 11 Drawing Sheets

AMPLIFIER CIRCUIT AND RADIO RECEIVER

CROSS-REFERENCE TO RELATED APPLICATIONS

This application is based upon and claims the benefit of priority from the prior Japanese Patent Application No. 2008-325434, filed on Dec. 22, 2008, the entire contents of which are incorporated herein by reference.

BACKGROUND OF THE INVENTION

1. Field of the Invention

The present invention relates to an amplifier circuit and a radio receiver, and, more particularly, is suitably applied to a method of reducing noise caused by an operational amplifier while suppressing an increase in current consumption of the operational amplifier.

2. Description of the Related Art

In a radio receiver and the like, IV conversion is performed by using a trans-impedance amplifier to amplify a micro current signal. To reduce noise caused by the trans-impedance amplifier, there is a method of increasing an electric current flowing to the trans-impedance amplifier.

For example, Japanese Patent Application Laid-Open No. H6-342561 discloses an equalizer filter including a variable conductance amplifier, a load resistor, a variable negative resistor, a capacitor, means for detecting the amplitude of output of the filter, and means for controlling, with an electric current, the resistance of the variable negative resistor and a method of controlling the resistance of the variable negative resistor such that the output amplitude detected by the amplitude detecting means coincides with amplitude information set in advance in a resistor.

However, if the electric current flowing to the trans-impedance amplifier is increased to reduce the noise caused by the trans-impedance amplifier, power consumption of the trans-impedance amplifier increases. Further, an area occupied by the trans-impedance amplifier has to be increased.

With the method disclosed in Japanese Patent Application Laid-Open No. H6-342561, the negative resistor can cancel a resistance component of the load resistor connected to an output side of the variable conductance amplifier but cannot reduce the noise caused by the variable conductance amplifier.

BRIEF SUMMARY OF THE INVENTION

An amplifier circuit according to an embodiment of the present invention comprises: an operational amplifier; a feedback resistor connected between an input terminal and an output terminal of the operational amplifier; and a negative resistor connected between an inverting input terminal and a noninverting input terminal of the operational amplifier.

An amplifier circuit according to an embodiment of the present invention comprises: an operational amplifier; a feedback resistor connected between an inverting input terminal and an output terminal of the operational amplifier; and a negative resistor connected to the inverting input terminal of the operational amplifier.

A radio receiver according to an embodiment of the present invention comprises: a reception antenna that receives a radio frequency signal propagating in a space; a low-noise amplifier that amplifies the radio frequency signal received by the reception antenna; a down-converter that converts the radio frequency signal amplified by the low-noise amplifier into a baseband signal or an intermediate frequency signal; and an amplifier circuit that amplifies the base band signal or the intermediate frequency signal converted by the down-converter, wherein the amplifier circuit includes: an operational amplifier; a feedback resistor connected between an input terminal and an output terminal of the operational amplifier; and a negative resistor connected between an inverting input terminal and a noninverting input terminal of the operational amplifier.

DETAILED DESCRIPTION OF THE INVENTION

Exemplary embodiments of the present invention are explained in detail below with reference to the accompanying drawings. The present invention is not limited by the embodiments.

Figure 1:
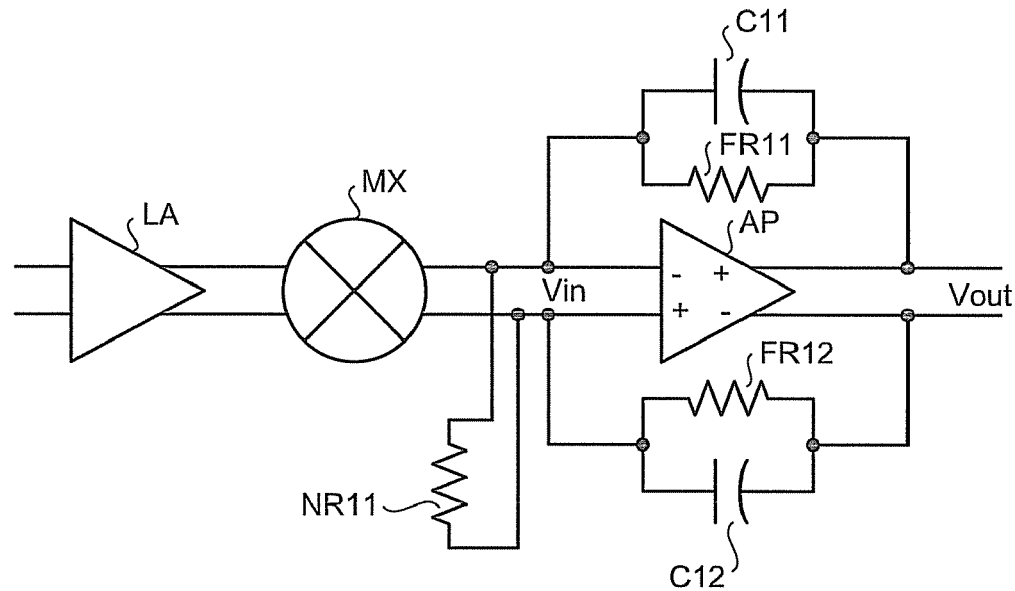
FIG. 1 is a block diagram of a schematic configuration of a radio receiving circuit to which an amplifier circuit according to a first embodiment of the present invention is applied.

FIG. 1 is a block diagram of a schematic configuration of a radio receiving circuit to which an amplifier circuit according to a first embodiment of the present invention is applied.

In FIG. 1, a mixer MX is connected to a post-stage of a low-noise amplifier LA. An operational amplifier AP is connected to a post-stage of the mixer MX. The low-noise amplifier LA can amplify a radio frequency signal received by a reception antenna. The mixer MX can down-convert the radio frequency signal amplified by the low-noise amplifier LA into a baseband signal or an intermediate frequency signal.

An inverting input terminal and a noninverting input terminal are provided in the operational amplifier AP. An inverting output terminal and a noninverting output terminal are also provided in the operational amplifier AP. The inverting output terminal of the operational amplifier AP is connected to the inverting input terminal thereof via a feedback resistor FR11. A capacitor C11 is connected in parallel to the feedback resistor FR11. The noninverting output terminal of the operational amplifier AP is connected to the noninverting input terminal thereof via a feedback resistor FR12. A capacitor C12 is connected in parallel to the feedback resistor FR12. A negative resistor NR11 is connected between the inverting input terminal and the noninverting input terminal of the operational amplifier AP.

It is preferable to set power consumption of the operational amplifier AP such that noise caused by the negative resistor NR11 is smaller than noise caused by the operational amplifier AP.

When an input signal Vin is input to the operational amplifier AP, the input signal Vin is amplified by the operational amplifier AP and then output as an output signal Vout. Voltage output from the operational amplifier AP is fed back to the inverting input terminal and the noninverting input terminal via the feedback resistors FR11 and FR12, respectively. This makes it possible to cause the operational amplifier AP to operate as a trans-impedance amplifier and cause the operational amplifier AP to perform IV conversion. The capacitors C11 and C12 are connected in parallel to the feedback resistors FR11 and FR12, respectively. This makes it possible to cause the operational amplifier AP to also operate as a low-pass filter. When the operational amplifier AP causes noise, the noise is superimposed on the output signal Vout and output.

The noise caused by the operational amplifier AP is affected by resistance components that depend on an input resistor viewed from an input side of the operational amplifier AP and the feedback resistors FR11 and FR12. Therefore, the negative resistor NR11 is connected between the inverting input terminal and the noninverting input terminal of the operational amplifier AP and the resistance components, which depend on the input resistor viewed from the input side of the operational amplifier AP and the feedback resistors FR11 and FR12, is canceled in the negative resistor NR11. This makes it possible to reduce the noise caused by the operational amplifier AP. For example, the negative resistor NR11 is connected between the inverting input terminal and the noninverting input terminal of the operational amplifier AP. This makes it possible to improve a noise figure (NF) from 2.1 dB to 1.7 dB.

The noise caused by the operational amplifier AP can also be reduced by increasing a bias current flowing to the operational amplifier AP. In this case, for example, to improve the NF from 2.1 dB to 1.7 dB to increase the bias current flowing to the operational amplifier AP, power consumption of the operational amplifier AP increases by about 50 to 100%.

On the other hand, with the method of connecting the negative resistor NR11 between the inverting input terminal and the noninverting input terminal of the operational amplifier AP, it is sufficient to cause the negative resistor NR11 to consume power equivalent to about 10% of power consumption of the operational amplifier AP. This makes it possible to suppress an increase in power consumption of the trans-impedance amplifier and also suppress an increase in an area occupied by the trans-impedance amplifier.

Figure 2:
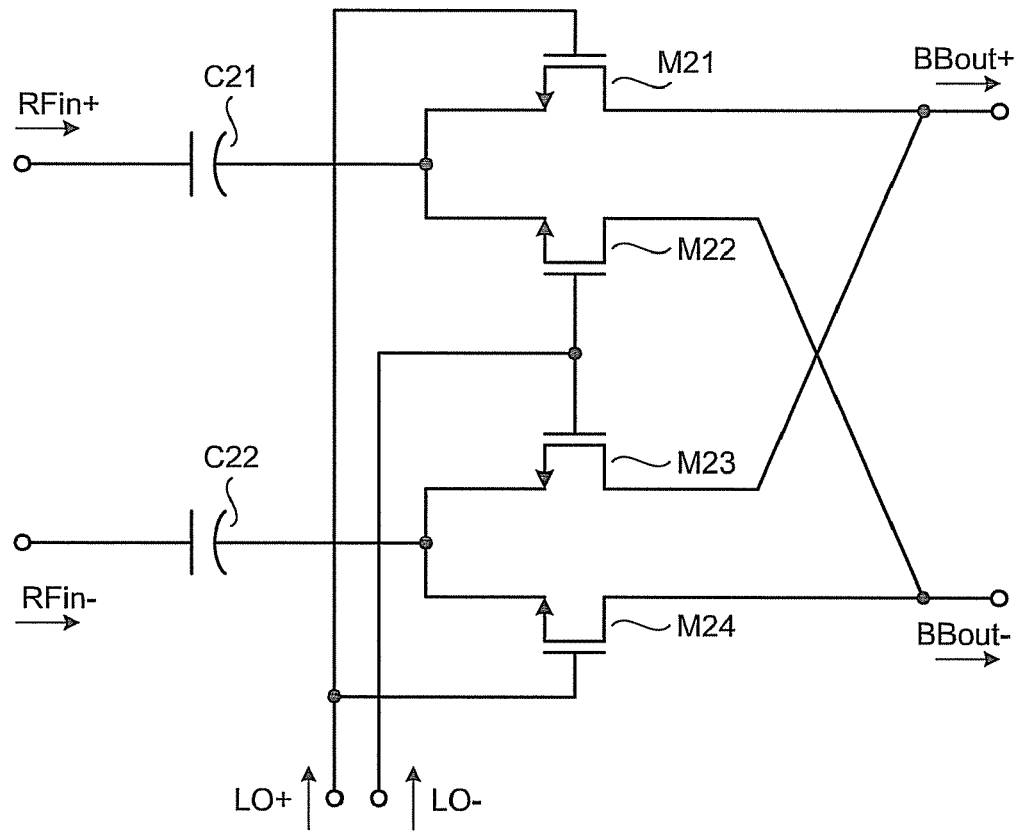
FIG. 2 is a diagram of an example of a circuit configuration of a mixer MX shown in FIG. 1.

FIG. 2 is a diagram of an example of a circuit configuration of the mixer MX shown in FIG. 1.

In FIG. 2, the mixer MX includes field effect transistors M21 to M24. Sources of the field effect transistors M21 and M22 are connected to each other and sources of the field effect transistors M23 and M24 are connected to each other. Drains of the field effect transistors M21 and M23 are connected to each other and drains of the field effect transistors M22 and M24 are connected to each other. Gates of the field effect transistors M21 and M24 are connected to each other and gates of the field effect transistors M22 and M23 are connected to each other.

A local oscillation signal $LO^+$ is input in common to the gates of the field effect transistors M21 and M24 and a local oscillation signal $LO^-$ is input in common to the gates of the field effect transistors M22 and M23. The field effect transistors M21 to M24 are turned on and off by the local oscillation signals $LO^+$ and $LO^-$. Consequently, radio frequency signals $RFin^+$ and $RFin^-$ are multiplied with the local oscillation signal $LO^+$ and $LO^-$, converted into baseband signals $BBout^+$ and $BBout^-$, and output.

As explained above, the noise caused by the operational amplifier AP can be reduced by connecting the negative resistor NR1 between the inverting input terminal and the noninverting input terminal of the operational amplifier AP. A reason for this is explained below.

Figure 3:
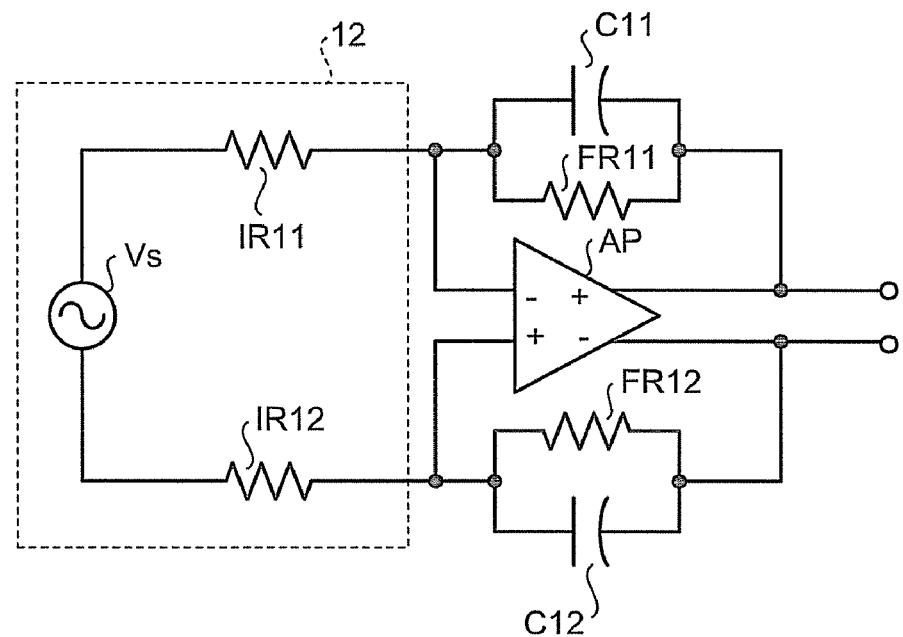
FIG. 3 is a diagram of a configuration in which an input side of an operational amplifier AP shown in FIG. 1 is modeled by using a signal source and input resistors.

FIG. 3 is a diagram of a configuration in which the input side of the operational amplifier AP shown in FIG. 1 is modeled by using a signal source and input resistors.

In FIG. 3, when the mixer MX shown in FIG. 2 is modeled in a baseband frequency domain, the mixer MX can be represented by using a signal source Vs and input resistors IR11 and IR12. The input resistor IR11 is connected to the inverting input terminal of the operational amplifier AP and the input resistor IR12 is connected to the noninverting input terminal of the operational amplifier AP. This makes it possible to represent a configuration in which the mixer MX is connected to a pre-stage of the operational amplifier AP shown in FIG. 1.

Figure 4:
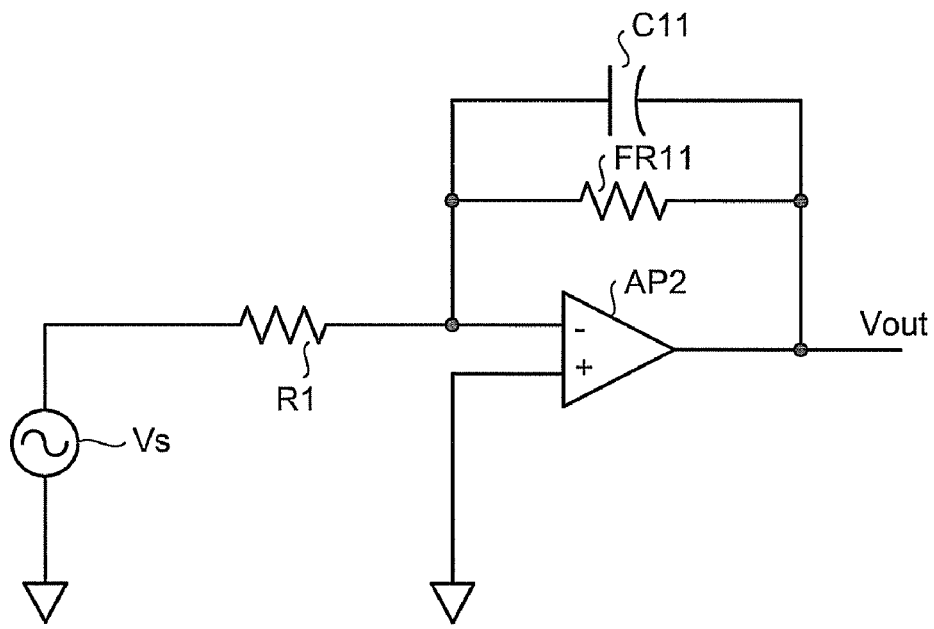
FIG. 4 is a diagram of a circuit configuration in which a noninverting input terminal of an operational amplifier AP2 is grounded.

FIG. 4 is a diagram of a circuit configuration in which a noninverting input terminal of an operational amplifier AP2 is grounded.

In FIG. 4, a configuration in which an input side of the operational amplifier AP2 can be represented by a configuration in which the noninverting input terminal of the operational amplifier AP2 is grounded and the signal source Vs is connected to an inverting input terminal of the operational amplifier AP2 via an input resistor R1.

Figure 5:
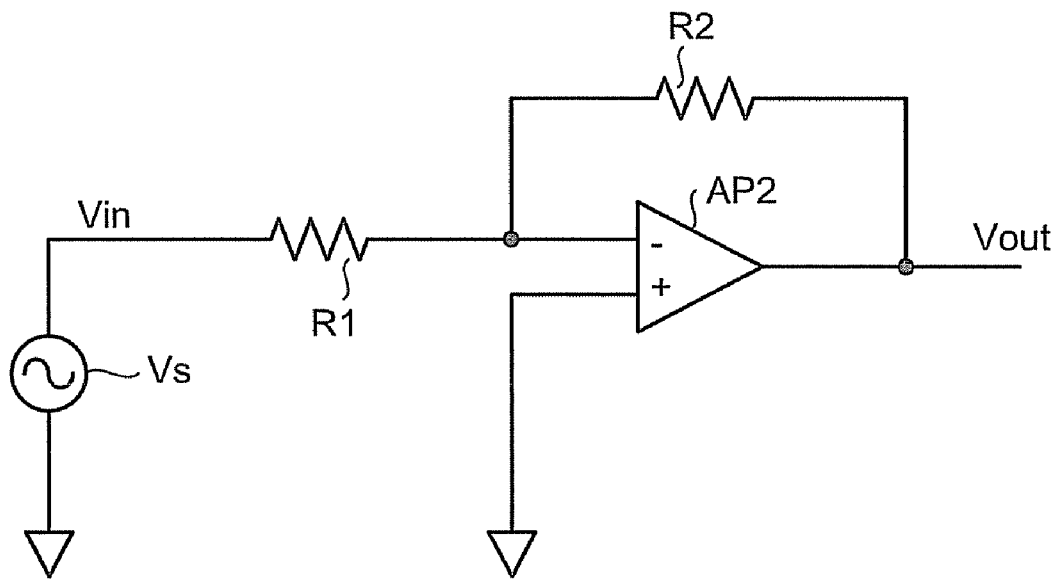
FIG. 5 is a diagram of a general circuit configuration in which the operational amplifier AP2 is used as a trans-impedance amplifier.

FIG. 5 is a diagram of a general circuit configuration in which the operational amplifier AP shown in FIG. 1 is used as a trans-impedance amplifier.

In FIG. 5, the noninverting input terminal of the operational amplifier AP2 is grounded, the signal source Vs is connected to the inverting input terminal of the operational amplifier AP2 via the input resistor R1, and a feedback resistor R2 is connected between an output terminal and the inverting input terminal of the operational amplifier AP2. This makes it possible to configure the trans-impedance amplifier. The configuration shown in FIG. 5 coincides with a configuration obtained be removing the capacitor C11 from the configuration shown in FIG. 4.

Figure 6:
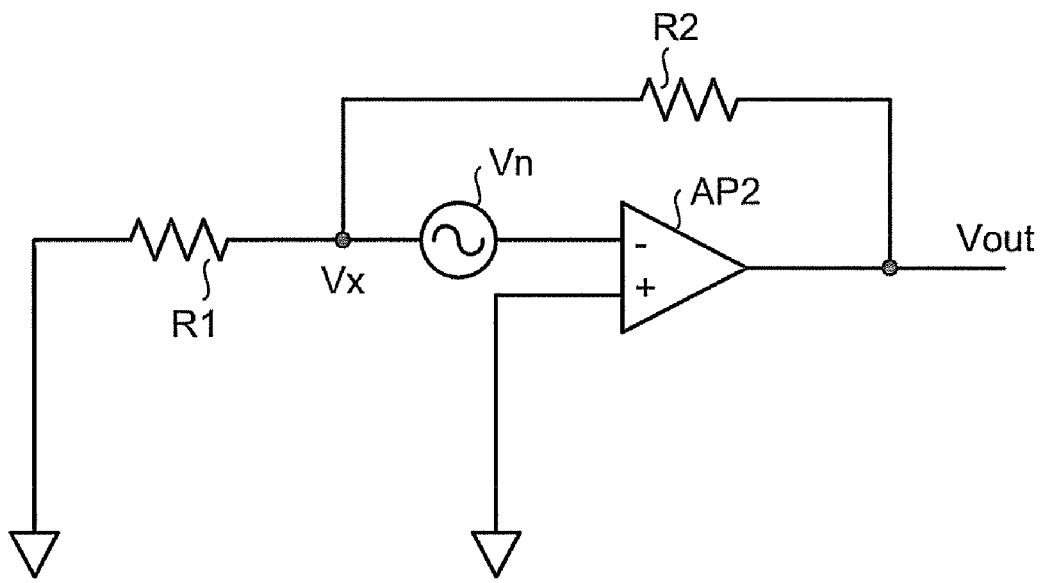
FIG. 6 is a diagram of a configuration in which a signal source Vs is removed from the trans-impedance amplifier shown in FIG. 5 and a noise source Vn of the operational amplifier AP2 is represented in terms of input.

FIG. 6 is a diagram of a configuration in which the signal source Vs is removed from the trans-impedance amplifier shown in FIG. 5 and the noise source Vn of the operational amplifier AP2 is represented in terms of input.

In FIG. 6, when the noise source Vn of the operational amplifier AP2 is represented in terms of input, the noise source Vn is connected to the inverting input terminal of the operational amplifier AP2.

Figure 7:
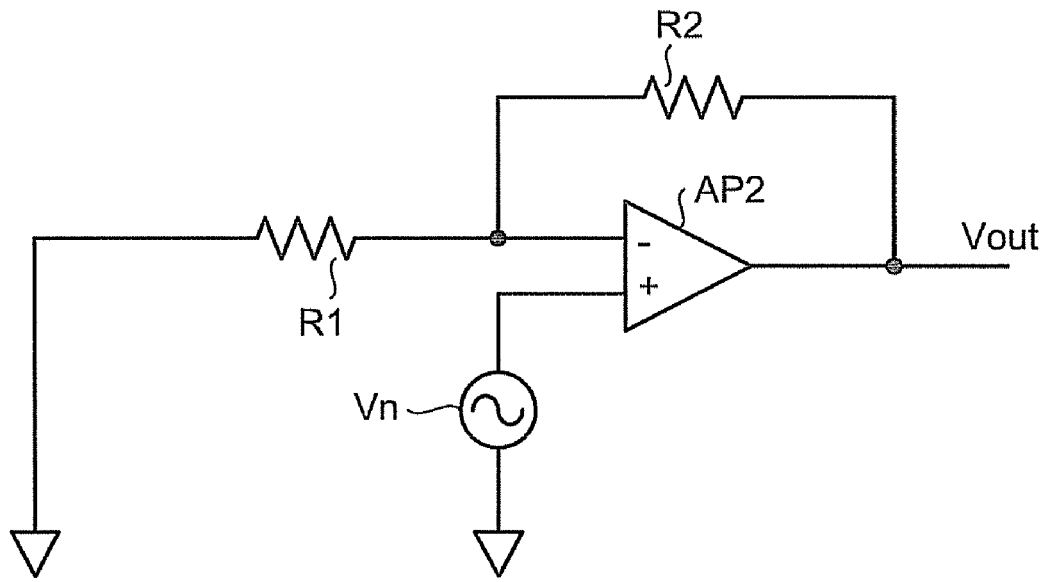
FIG. 7 is a diagram of a configuration represented by relocating the noise source Vn shown in FIG. 6 to a ground side of the input of the operational amplifier AP2.

FIG. 7 is a diagram of a configuration represented by relocating the noise source Vn shown in FIG. 6 to a ground side of the input of the operational amplifier AP2.

In FIG. 7, when the output of the operational amplifier AP2 is fed back to the input and a gain Av of the operational amplifier AP2 is large, a potential difference between the inverting input terminal and the noninverting input terminal of the operational amplifier AP2 is 0. Therefore, a connection point between the noise source Vn and the input resistor R1 can be regarded as an imaginary ground. There is no distinction of plus and minus in noise. Therefore, a configuration can be regarded as equivalent even if the noise source Vn shown in FIG. 6 is relocated to the noninverting input terminal side of the operational amplifier AP2.

Figure 8:
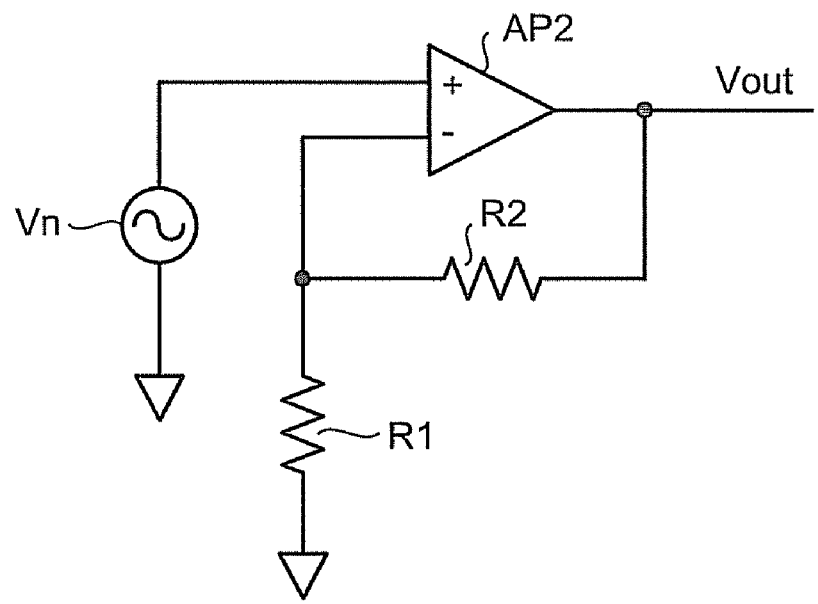
FIG. 8 is a diagram of a configuration in which the configuration shown in FIG. 7 is redrawn.

FIG. 8 is a diagram of a configuration in which the configuration shown in FIG. 7 is redrawn.

In FIG. 8, it is seen that the configuration obtained by rewriting the configuration shown in FIG. 7 is a voltage follower. When a value of the input resistor R1 is represented as R1 and a value of the feedback resistor R2 is represented as R2, a gain Gv of a circuit shown in FIG. 8 can be represented by 1+R2/R1. Therefore, when a value of the noise of the noise source Vn is represented as Vn, a value of noise Vnout output from the operational amplifier AP2 can be represented by Vn(1+R2/R1).

Figure 9:
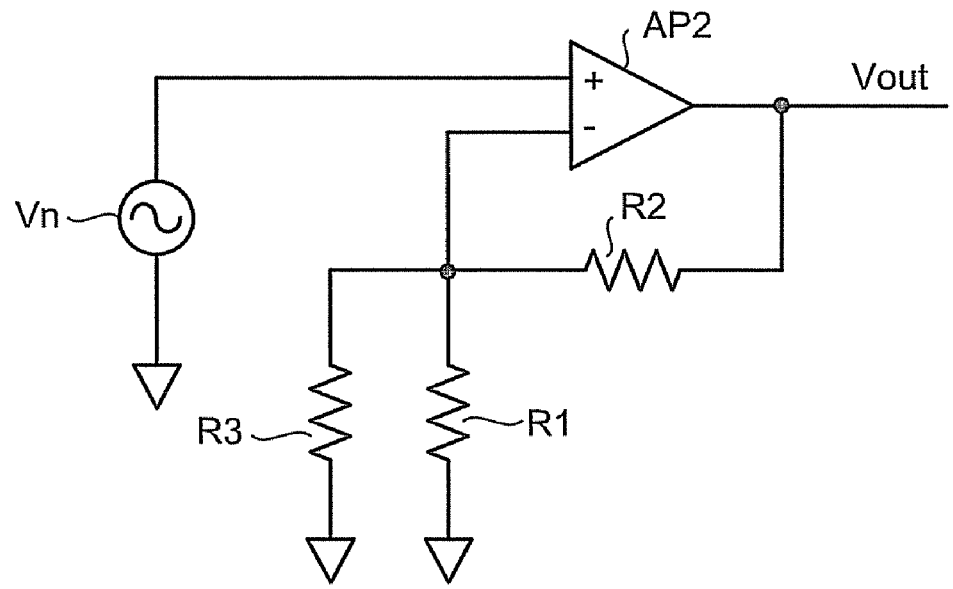
FIG. 9 is a diagram of a configuration in which a negative resistor R3 is added to an input side of the operational amplifier AP2 shown in FIG. 8.

FIG. 9 is a diagram of a configuration in which a negative resistor R3 is added to the input side of the operational amplifier AP2 shown in FIG. 8.

In FIG. 9, when the negative resistor R3 is added to the inverting input terminal of the operational amplifier AP2 shown in FIG. 8, a value of the noise Vnout output from the operational amplifier AP2 can be represented by Vn(1+R2(R1+R3)/(R1R3)). When a value of the negative resistor R3 is represented as R3, the value of the noise Vnout output from the operational amplifier AP2 can be reduced to 0 by setting the value of the negative resistor R3 to satisfy a condition R3=−R1R2/(R1+R2).

Figure 10:
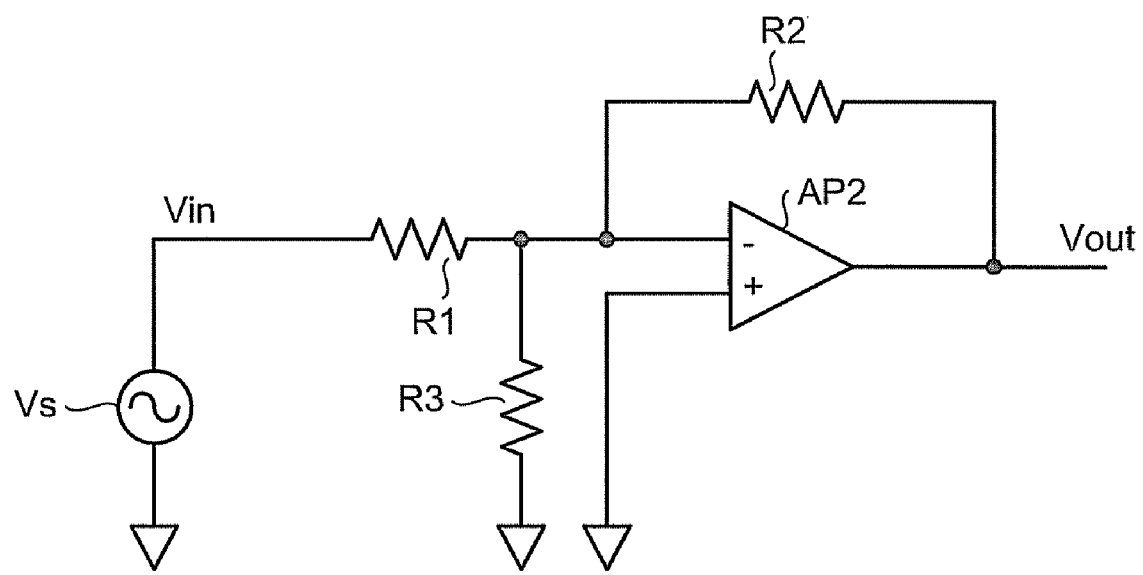
FIG. 10 is a diagram of a configuration represented by adding the negative resistor R3 shown in FIG. 9 to the trans-impedance amplifier shown in FIG. 5.

FIG. 10 is a diagram a configuration represented by adding the negative resistor R3 shown in FIG. 9 to the trans-impedance amplifier shown in FIG. 5.

A gain Gv of a circuit shown in FIG. 10 can be represented by AvR2/(R1(1−Av)+R2+R1R2/R3). When the gain Av of the operational amplifier AP2 is sufficiently large, the gain Gv of the circuit shown in FIG. 10 can be represented by −R2/R1 and is the same as the gain obtained when the negative resistor R3 is not added (FIG. 5).

Figure 11:
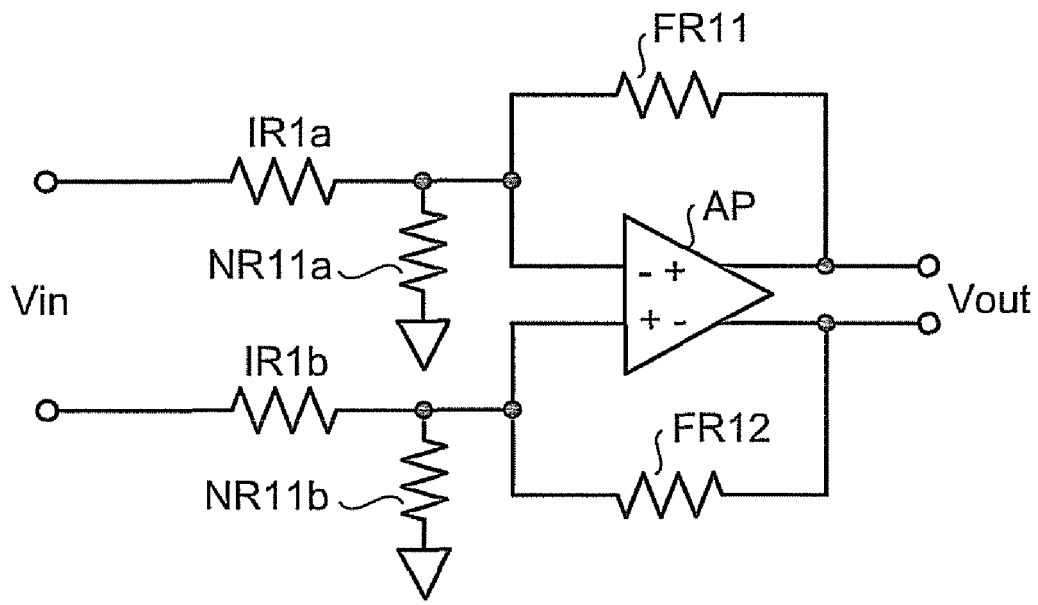
FIG. 11 is a circuit diagram of a schematic configuration of an amplifier circuit according to a second embodiment of the present invention.

FIG. 11 is a circuit diagram of a schematic configuration of an amplifier circuit according to a second embodiment of the present invention.

In FIG. 11, the inverting output terminal of the operational amplifier AP is connected to the inverting input terminal thereof via the feedback resistor FR11. An input resistor IR1a and a negative resistor NR11a are connected to the inverting input terminal of the operational amplifier AP.

The noninverting output terminal of the operational amplifier AP is connected to the noninverting input terminal thereof via the feedback resistor FR12. An input resistor IR1b and a negative resistor NR11b are connected to the noninverting input terminal of the operational amplifier AP. The resistance of the input resistors IR1a and IR1b can be output impedance at the pre-stage of the operational amplifier AP.

The negative resistor NR11a is connected to the inverting input terminal of the operational amplifier AP and the negative resistor NR11b is connected to the noninverting input terminal of the operational amplifier AP. This makes it possible to cancel, in the negative resistors NR11a and NR11b, resistance components that depend on the input resistors IR1a and IR1b and the feedback resistors FR11 and FR12. Even when a differential trans-impedance amplifier is configured by the operational amplifier AP, it is possible to reduce the noise caused by the operational amplifier AP.

Figure 12:
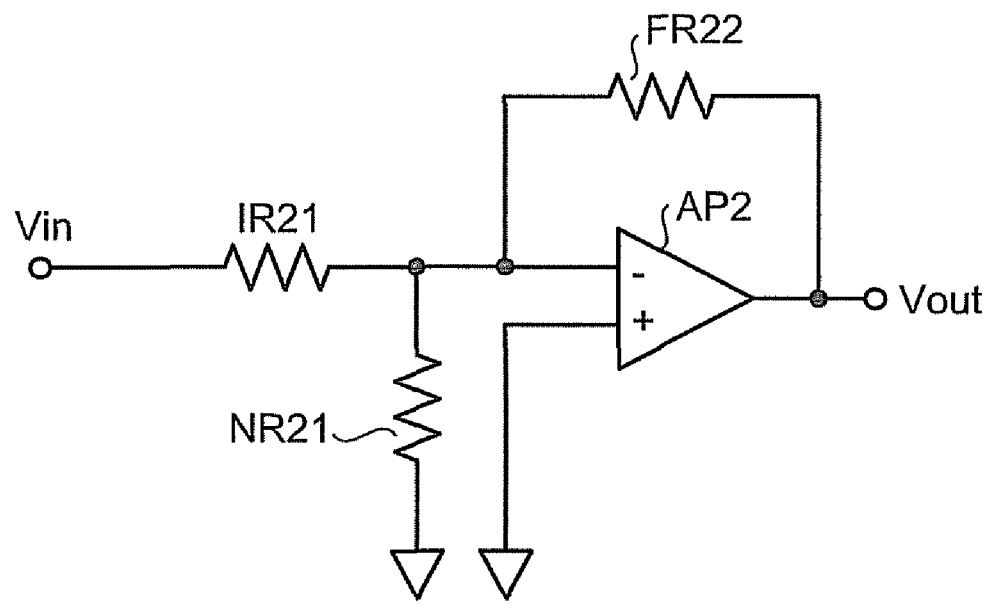
FIG. 12 is a circuit diagram of a schematic configuration of an amplifier circuit according to a third embodiment of the present invention.

FIG. 12 is a circuit diagram of a schematic configuration of an amplifier circuit according to a third embodiment of the present invention.

In FIG. 12, the inverting output terminal of the operational amplifier AP2 is connected to the inverting input terminal thereof via the feedback resistor FR22. The input resistor IR21 and the negative resistor NR21 are connected to the inverting input terminal of the operational amplifier AP2. The noninverting output terminal of the operational amplifier AP2 is grounded. The resistance of the input resistor IR21 can be output impedance at a pre-stage of the operational amplifier AP2.

The negative resistor NR21 is connected to the inverting input terminal of the operational amplifier AP2. This makes it possible to cancel, in the negative resistor NR21, resistance components that depend on the input resistor IR21 and the feedback resistor FR22. Even when a single-phase trans-impedance amplifier is configured by the operational amplifier AP2, it is possible to reduce the noise caused by the operational amplifier AP2.

Figure 13:
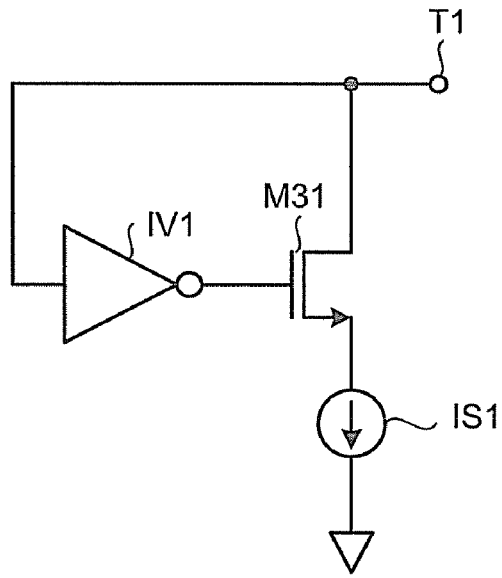
FIG. 13 is a diagram of a circuit configuration of a negative resistor used in an amplifier circuit according to a fourth embodiment of the present invention.

FIG. 13 is a diagram of a circuit configuration of a negative resistor used in an amplifier circuit according to a fourth embodiment of the present invention.

In FIG. 13, the negative resistor includes a field effect transistor M31, an inverter IV1, and a bias current source IS1. A drain of the field effect transistor M31 is connected to a gate thereof via the inverter IV. A source of the field effect transistor M31 is connected to the bias current source IS1. An output terminal T1 is provided in the drain of the field effect transistor M31.

Voltage applied to the drain of the field effect transistor M31 is inverted by the inverter IV1 and then applied to the gate of the field effect transistor M31. Therefore, when the potential at the output terminal T1 rises, the potential at the gate of the field effect transistor M31 falls and an electric current flowing to the field effect transistor M31 decreases. Consequently, the circuit shown in FIG. 13 can operate as a negative resistor.

The negative resistor shown in FIG. 13 can be used as the negative resistors NR11a and NR11b shown in FIG. 11 or the negative resistor NR21 shown in FIG. 12.

Figure 14:
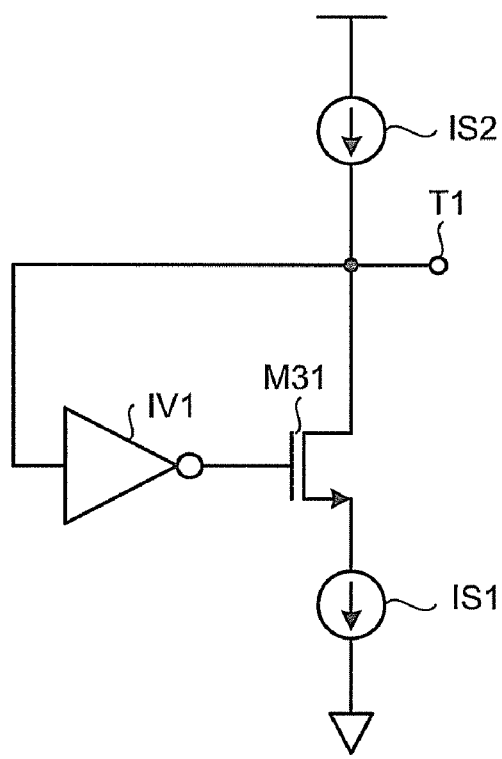
FIG. 14 is a diagram of a circuit configuration of a negative resistor used in an amplifier circuit according to a fifth embodiment of the present invention.

FIG. 14 is a diagram of a circuit configuration of a negative resistor used in an amplifier circuit according to a fifth embodiment of the present invention.

In FIG. 14, in addition to the components shown in FIG. 13, the negative resistor includes a bias current source IS2. The drain of the field effect transistor M31 is connected to the gate of the field effect transistor M31 via the inverter IV1 and is also connected to the bias current source IS2.

An electric current is supplied to the drain of the field effect transistor M31 from the bias current source IS2. This makes it possible to prevent an electric current from being extracted from the output terminal T1 side. Therefore, even when the output terminal T1 is connected to the input terminal of the operational amplifier AP shown in FIG. 11 or the input terminal of the operational amplifier AP2 shown in FIG. 12, it is possible to prevent the operation of the operational amplifiers AP and AP2 from being affected.

The negative resistor shown in FIG. 14 can be used as the negative resistors NR11a and NR11b shown in FIG. 11 or the negative resistor NR21 shown in FIG. 12.

Figure 15:
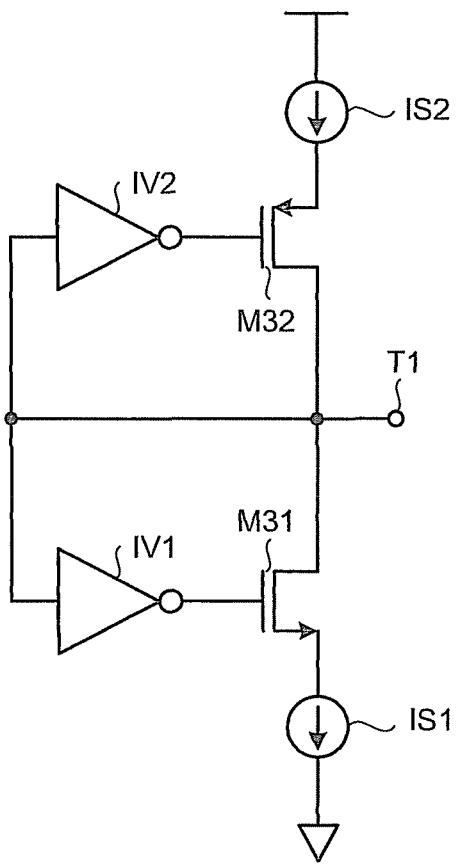
FIG. 15 is a diagram of a circuit configuration of a negative resistor used in an amplifier circuit according to a sixth embodiment of the present invention.

FIG. 15 is a diagram of a circuit configuration of a negative resistor used in an amplifier circuit according to a sixth embodiment of the present invention.

In FIG. 15, in addition to the components shown in FIG. 14, the negative resistor includes a field effect transistor M32 and an inverter IV2. A drain of the field effect transistor M32 is connected to a gate thereof via the inverter IV2. A source of the field effect transistor M32 is connected to the bias current source IS2. The drain of the field effect transistor M32 is connected to the drain of the field effect transistor M31.

Voltage applied to the drains of the field effect transistors M31 and M32 is inverted by the inverters IV1 and IV2 and then applied to the gates of the field effect transistors M31 and M32. Therefore, when the potential at the output terminal T1 rises, the potential at the gates of the field effect transistors M31 and M32 falls and electric currents flowing to the field effect transistors M31 and M32 decrease. Consequently, the circuit shown in FIG. 15 can operate as a negative resistor.

The negative resistor shown in FIG. 15 can be used as the negative resistors NR11a and NR11b shown in FIG. 11 or the negative resistor NR21 shown in FIG. 12.

Figure 16:
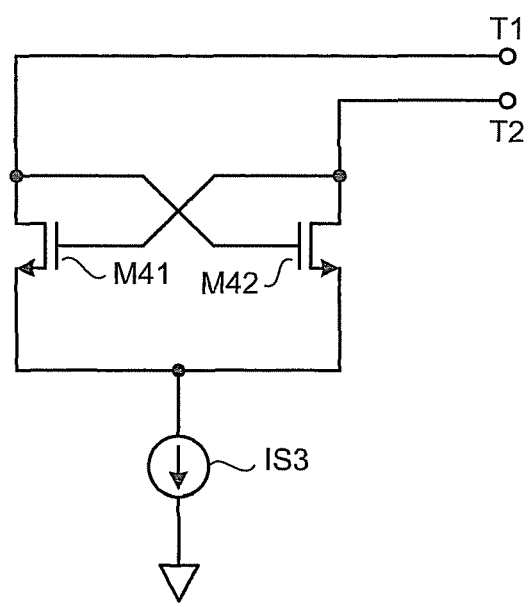
FIG. 16 is a diagram of a circuit configuration of a negative resistor used in an amplifier circuit according to a seventh embodiment of the present invention.

FIG. 16 is a diagram of a circuit configuration of a negative resistor used in an amplifier circuit according to a seventh embodiment of the present invention.

In FIG. 16, the negative resistor includes field effect transistors M41 and M42 and a bias current source IS3. A drain of the field effect transistor M41 is connected to a gate of the field effect transistor M42. A drain of the field effect transistor M42 is connected to a gate of the field effect transistor M41. Sources of the field effect transistors M41 and M42 are connected in common to the bias current source IS3. The output terminal T1 is provided in the drain of the field effect transistor M41. An output terminal T2 is provided in the drain of the field effect transistor M42.

Voltage applied to the drain of the field effect transistor M41 is applied to the gate of the field effect transistor M42. Voltage applied to the drain of the field effect transistor M42 is applied to the gate of the field effect transistor M41. When the potential at the output terminal T1 rises, an electric current flowing into the output terminal T2 increases and an electric current flowing from the output terminal T1 to the output terminal T2 decreases. Therefore, the circuit shown in FIG. 16 can operate as a negative resistor.

The negative resistor shown in FIG. 16 can be used as the negative resistor NR11 shown in FIG. 1.

Figure 17:
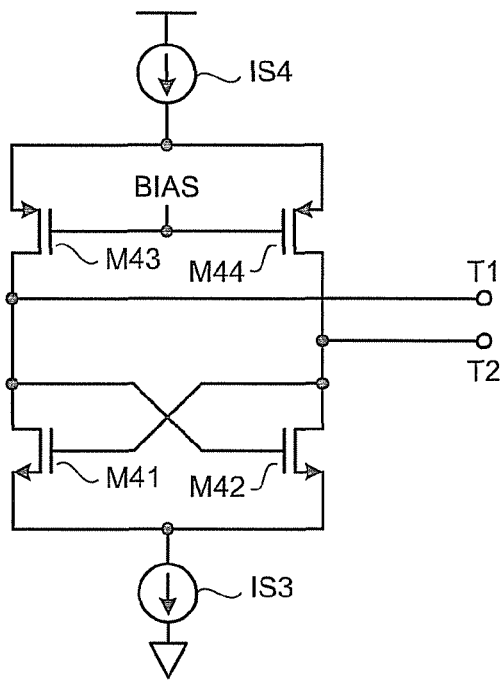
FIG. 17 is a diagram of a circuit configuration of a negative resistor used in an amplifier circuit according to an eighth embodiment of the present invention.

FIG. 17 is a diagram of a circuit configuration of a negative resistor used in an amplifier circuit according to an eighth embodiment of the present invention.

In FIG. 17, in addition to the components shown in FIG. 16, the negative resistor includes field effect transistors M43 and M44 and a bias current source IS4. A drain of the field effect transistor M43 is connected to the drain of the field effect transistor M41. A drain of the field effect transistor 44 is connected to the drain of the field effect transistor M42. Gates of the field effect transistors M43 and M44 are connected to each other and bias is applied to the gates. Sources of the field effect transistors M43 and M44 are connected in common to the bias current source IS4.

An electric current is supplied to the drains of the field effect transistors M41 and M42 from the bias current source IS4. This makes it possible to prevent an electric current from being extracted from the output terminals T1 and T2 side. Therefore, even when the output terminals T1 and T2 are connected between the input terminals of the operational amplifier AP shown in FIG. 1, it is possible to prevent the operation of the operational amplifier AP from being affected.

The negative resistance shown in FIG. 17 can be used as the negative resistance NR11 shown in FIG. 1.

Figure 18:
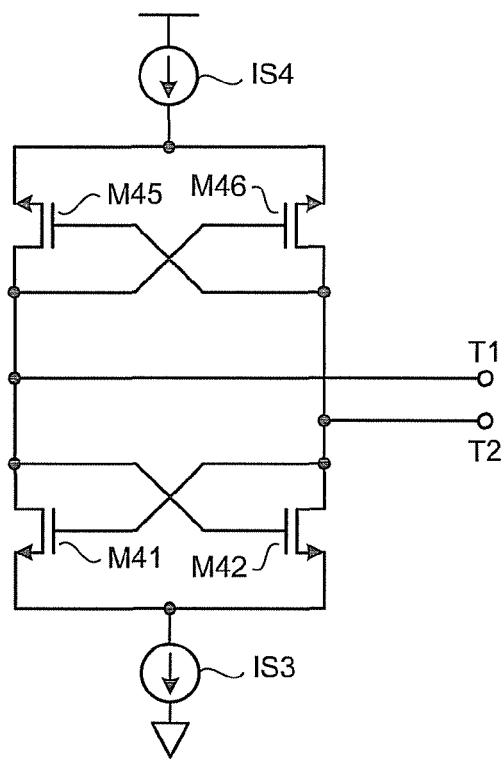
FIG. 18 is a diagram of a circuit configuration of a negative resistor used in an amplifier circuit according to a ninth embodiment of the present invention.

FIG. 18 is a diagram of a circuit configuration of a negative resistor used in an amplifier circuit according to a ninth embodiment of the present invention.

In FIG. 18, in addition to the components shown in FIG. 16, the negative resistor includes field effect transistors M45 and M46 and a bias current source IS4. A drain of the field effect transistor M45 is connected to the drain of the field effect transistor M41. A drain of the field effect transistor M46 is connected to the drain of the field effect transistor M42. A gate of the field effect transistor M45 is connected to the drain of the field effect transistor M46. A gate of the field effect transistor M46 is connected to the drain of the field effect transistor M45. Sources of the field effect transistors M45 and M46 are connected in common to the bias current source IS4.

Voltage applied to the drains of the field effect transistors M41 and M45 is applied to the gates of the field effect transistors M42 and M46. Voltage applied to the drains of the field effect transistors M42 and M46 is applied to the gates of the field effect transistors M41 and M45. When the potential at the output terminal T1 rises, an electric current flowing into the output terminal T2 increases and an electric current flowing from the output terminal T1 to the output terminal T2 decreases. Therefore, the circuit shown in FIG. 18 can operate as a negative resistor.

The negative resistor shown in FIG. 18 can be used as the negative resistor NR11 shown in FIG. 1.

In the configurations shown in FIGS. 16 to 18, the negative resistor can be realized without using the inverters IV1 and IV12 shown in FIGS. 13 to 15. Noise caused by the inverters IV1 and IV12 is not input to the operational amplifier AP. Therefore, it is possible to improve an NF.

Figure 19:
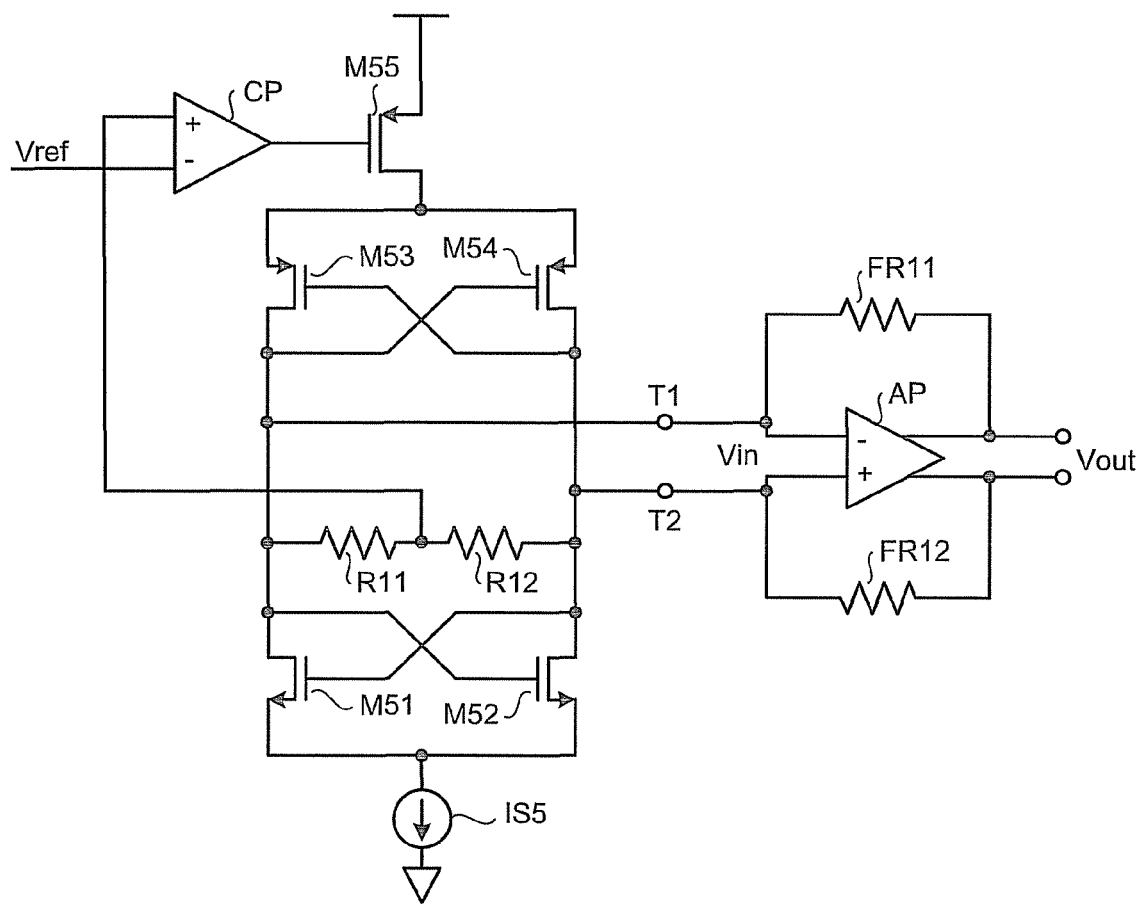
FIG. 19 is a diagram of a circuit configuration of a negative resistor used in an amplifier circuit according to a tenth embodiment of the present invention.

FIG. 19 is a diagram of a circuit configuration of a negative resistor used in an amplifier circuit according to a tenth embodiment of the present invention.

In FIG. 19, the negative resistor includes field effect transistors M51 to M55, a bias current source IS5, detection resistors R11 and R12, and a comparator CP. A drain of the field effect transistor M51 is connected to a gate of the field effect transistor M52. A drain of the field effect transistor M52 is connected to a gate of the field effect transistor M51.

Sources of the field effect transistors M51 and M52 are connected in common to the bias current source IS5. The output terminal T1 is provided in the drain of the field effect transistor M51. The output terminal T2 is provided in the drain of the field effect transistor M52.

A drain of the field effect transistor M53 is connected to the drain of the field effect transistor M51. A drain of the field effect transistor M54 is connected to the drain of the field effect transistor M52. A gate of the field effect transistor M53 is connected to the drain of the field effect transistor M54. A gate of the field effect transistor M54 is connected to the drain of the field effect transistor M53. Sources of the field effect transistors M53 and M54 are connected in common to a drain of the field effect transistor M55.

A series circuit of the detection resistors R11 and R12 are connected between the drains of the field effect transistors M51 and M52. A negative side terminal of the comparator CP is connected to reference potential Vref. An output terminal of the comparator CP is connected to a gate of the field effect transistor M55. The reference potential Vref can apply potential serving as a reference of an output DC bias of the operational amplifier AP.

The output terminal T1 of the negative resistor is connected to the noninverting input terminal of the operational amplifier AP. The output terminal T2 of the negative resistor is connected to the inverting input terminal of the operational amplifier AP.

When DC bias of the output signal Vout of the operational amplifier is fed back to be the same potential as the reference potential Vref, DC bias of the input signal Vin of the operational amplifier AP is the same potential as the reference potential Vref.

The detection resistors R11 and R12 detect voltage between the output terminals T1 and T2 of the negative resistor and output the voltage to a positive side terminal of the comparator CP. The comparator CP compares the voltage between the output terminals T1 and T2 and the reference potential Vref and outputs a difference between the voltage and the reference potential Vref to the gate of the field effect transistor M55. An electric current corresponding to the difference flows to the field effect transistors M53 and M54 via the field effect transistor M55. The voltage between the output terminals T1 and T2 are controlled to be equal to the reference potential Vref.

This makes it possible to equalize the voltage between the output terminals T1 and T2 of the negative resistor with the voltage between the input terminals of the operational amplifier AP. Even when the negative resistor is connected between the input terminals of the operational amplifier AP, it is possible to prevent a DC current from flowing between the operational amplifier AP and the negative resistor.

Figure 20:
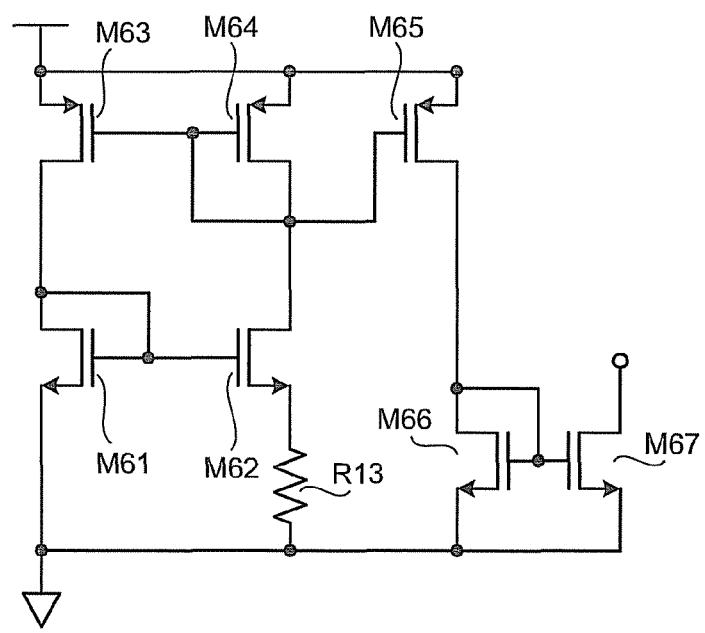
FIG. 20 is a diagram of a circuit configuration of a bias current source of a negative resistor used in an amplifier circuit according to an eleventh embodiment of the present invention.

FIG. 20 is a diagram of a circuit configuration of a bias current source of a negative resistor used in an amplifier circuit according to an eleventh embodiment of the present invention.

In FIG. 20, the bias current source includes field effect transistors M61 to M67 and a resistor R13. A source of the field effect transistor M61 is connected to sources of the field effect transistors M61, M66, and M67 via the resistor R13. Gates of the field effect transistors M61 and M62 are connected to a drain of the field effect transistor M61. Gates of the field effect transistors M66 and M67 are connected to a drain of the field effect transistor M66.

A drain of the field effect transistor M63 is connected to the drain of the field effect transistor M61. A drain of the field effect transistor M64 is connected to a drain of the field effect transistor M62. A drain of the field effect transistor M65 is connected to the drain of the field effect transistor M66. Gates of the field effect transistors M63 to M65 are connected to the drain of the field effect transistor M62. Sources of the field effect transistors M63 to M65 are connected in common.

The gate widths of the field effect transistors M63 and M64 are set the same. The gate width of the field effect transistor M62 is set to be larger than the gate width of the field effect transistor M61.

An electric current that depends on the gate widths of the field effect transistors M61 and M62 and a value of the resistor R13 flows to the drain of the field effect transistor M62. According to current mirror operation of the field effect transistors M64 and M65, an electric current corresponding to a value of the electric current flowing to the drain of the field effect transistor M62 flows to the drain of the field effect transistor M66. According to current mirror operation of the field effect transistors M66 and M67, an electric current corresponding to a value of the electric current flowing to the drain of the field effect transistor M66 flows to a drain of the field effect transistor M67 and a bias current is output.

This makes it possible to keep the conductance of the bias current source constant. Even when fluctuation in characteristics of the field effect transistors or temperature fluctuation occurs, it is possible to stabilize a value of the negative resistor.

The bias current source shown in FIG. 20 can be used as the bias current sources IS1 and IS2 shown in FIGS. 13 to 15, the bias current sources IS3 and IS4 shown in FIGS. 16 to 18, and the bias current source IS5 shown in FIG. 19.

Figure 21:
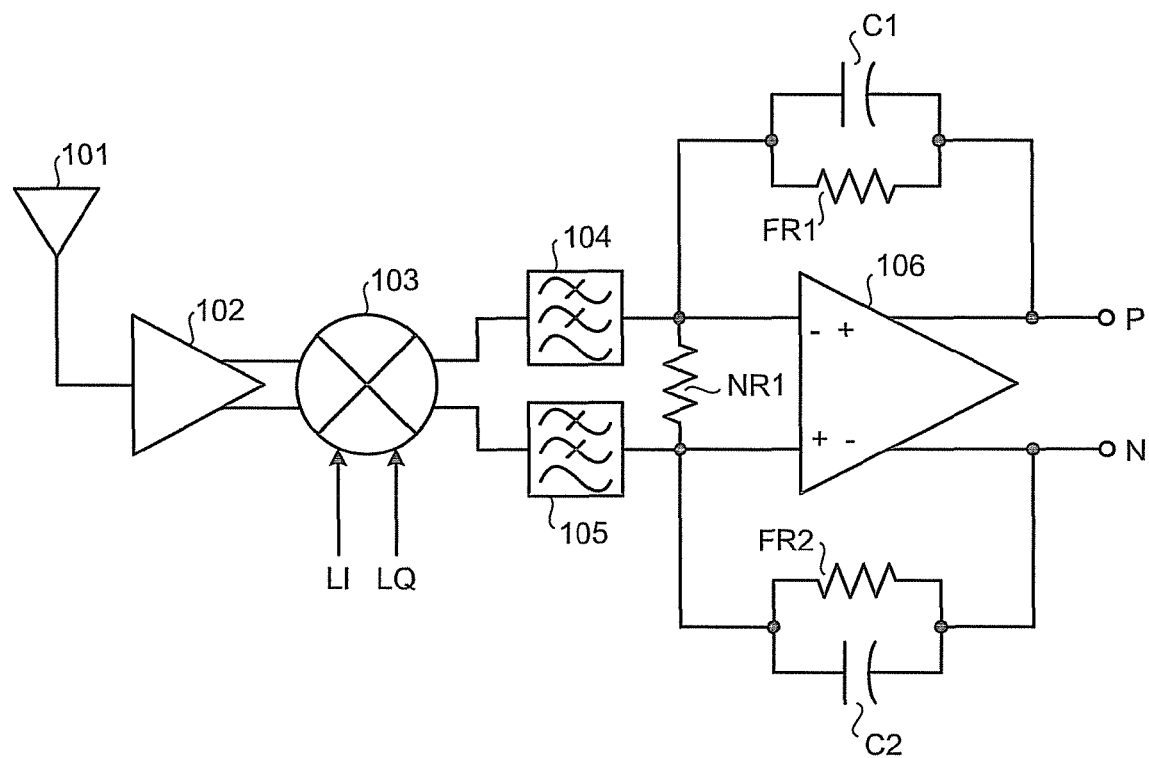
FIG. 21 is a block diagram of a schematic configuration of a radio receiver to which an amplifier circuit according to a twelfth embodiment of the present invention is applied.

FIG. 21 is a block diagram of a schematic configuration of a radio receiver to which an amplifier circuit according to a twelfth embodiment of the present invention is applied.

In FIG. 21, the radio receiver includes a reception antenna 101 that receives a radio frequency signal propagating in a space, a low-noise amplifier 102 that amplifies the radio frequency signal received by the reception antenna 101, a differential down-converter 103 that performs down-convert of a reception signal, filter elements 104I and 105I that remove unnecessary high-frequency components from a differential in-phase component I output from the down-converter 103, filter elements 104Q and 105Q that remove unnecessary high-frequency components from a differential orthogonal component Q output from the down-converter 103, an operational amplifier 106Q that amplifies a micro current signal that has passed through the filter elements 104Q and 105Q, and an operational amplifier 106Q that amplifies a micro current signal that has passed through the filter elements 104Q and 105Q.

An inverting input terminal and a noninverting input terminal are provided in the operational amplifier 106I. An inverting output terminal and a noninverting output terminal are also provided in the operational amplifier 106I. The inverting output terminal of the operational amplifier 106I is connected to the inverting input terminal thereof via a feedback resistor FR1I. A capacitor C1I is connected in parallel to the feedback resistor FR1I. The noninverting output terminal of the operational amplifier 106I is connected to the noninverting input terminal thereof via a feedback resistor FR2I. A capacitor C2I is connected in parallel to the feedback resistor FR2I. A negative resistor NR1I is connected between the inverting input terminal and the noninverting input terminal of the operational amplifier 106I.

An inverting input terminal and a noninverting input terminal are provided in the operational amplifier 106Q. An inverting output terminal and a noninverting output terminal are also provided in the operational amplifier 106Q. The inverting output terminal of the operational amplifier 106Q is connected to the inverting input terminal thereof via a feedback resistor FR1Q. A capacitor C1Q is connected in parallel to the feedback resistor FR1Q. The noninverting output terminal of the operational amplifier 106Q is connected to the noninverting input terminal thereof via a feedback resistor FR2Q. A capacitor C2Q is connected in parallel to the feedback resistor FR2Q. A negative resistor NR1Q is connected between the inverting input terminal and the noninverting input terminal of the operational amplifier 106Q.

A radio frequency signal received by the reception antenna 101 is amplified by the low-noise amplifier 102 and then input to the down-converter 103. In the down-converter 103, the radio frequency signal amplified by the low-noise amplifier 102 is multiplied with local oscillation signals LI and LQ to be down-converted. An in-phase component I and an orthogonal component Q of a baseband signal are generated.

Unnecessary frequency components of the in-phase component I and the orthogonal component Q of the baseband signal generated by the down-converter 103 are removed by the filter elements 104I, 105I, 104Q, and 105Q. Thereafter, the in-phase component I and the orthogonal component Q are respectively amplified by the operational amplifier 106I and the operational amplifier 106Q.

The negative resistors NR1I and NR1Q are respectively connected between the inverting input terminals and the noninverting input terminals of the operational amplifiers 106I and 106Q. This makes it possible to reduce noise caused by the operational amplifiers 106I and 106Q and improve an NF while suppressing an increase in power consumption of the operational amplifiers 106I and 106Q.

In the embodiment shown in FIG. 21, the method of applying the amplifier circuit shown in FIG. 1 to the radio receiver of the direct convert system is explained. However, the amplifier circuit shown in FIG. 1 can be applied to a radio receiver that once converts a radio frequency signal into an intermediate frequency signal and then converts the intermediate frequency signal into a baseband signal.

In the embodiments explained above, the negative resistor includes the field effect transistors. However, bipolar transistors can be used instead of the field effect transistors.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An amplifier circuit comprising:
    an operational amplifier;
    a feedback resistor connected between an input terminal and an output terminal of the operational amplifier; and
    a negative resistor directly connected between an inverting input terminal and a noninverting input terminal of the operational amplifier.

2. The amplifier circuit according to claim 1, wherein power consumption of the operational amplifier is set such that noise caused by the negative resistor is smaller than noise caused by the operational amplifier.

3. The amplifier circuit according to claim 1, further comprising an input resistor connected to the inverting input terminal and the noninverting input terminal of the operational amplifier.

4. The amplifier circuit according to claim 3, wherein the negative resistor cancels a resistor component that depends on the input resistor and the feedback resistor.

5. The amplifier circuit according to claim 1, further comprising a mixer connected to a pre-stage of the operational amplifier,
    wherein the mixer includes:
        a first field effect transistor;
        a second field effect transistor;
        a third field effect transistor;
        an inverter inserted between a drain and a gate of the field effect transistor;
        a fourth field effect transistor;
        wherein sources of the first and second field effect transistors are connected to each other, sources of the third and fourth field effect transistors are connected to each other, drains of the first and third field effect transistors are connected to each other, drains of the second and fourth field effect transistors are connected to each other, gates of the first and fourth field effect transistors are connected to each other, gates of the second and third field effect transistors are connected to each other, the gates of the first and fourth field effect transistors are connected to a first terminal that a first local oscillation signal may be input to, the gates of the second and third field effect transistors are connected to a second terminal that a second local oscillation signal may be input to, the sources of the first and second field effect transistors are connected to a third terminal through a first capacitor that a first radio frequency signal may be input to, the sources of the third and fourth field effect transistors are connected to a fourth terminal through a second capacitor that a second radio frequency signal may be input to.

6. The amplifier circuit according to claim 1, further comprising:
    a low-noise amplifier that amplifies an input radio frequency signal;
    a down converter that converts the radio frequency signal amplified by the low-noise amplifier into a baseband signal or an intermediate frequency signal, the down converter being connected to a pre-stage of the operational amplifier.

* * * * *